United States Patent
Balasubramaniyan

(10) Patent No.: US 6,320,425 B1
(45) Date of Patent: Nov. 20, 2001

(54) DUAL FET DIFFERENTIAL VOLTAGE CONTROLLED ATTENUATOR

(75) Inventor: Arul Balasubramaniyan, Round Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/614,324

(22) Filed: Jul. 12, 2000

(51) Int. Cl.$^7$ .................................................. H03K 5/22
(52) U.S. Cl. ................................................ 327/65; 327/308
(58) Field of Search .................................. 327/306, 308, 327/322, 327, 328, 65–66; 333/81 R; 330/258, 69

(56) References Cited

U.S. PATENT DOCUMENTS

| | | | |
|---|---|---|---|
| 3,581,222 | 5/1971 | Dunwoodie et al. | 330/284 |
| 4,155,047 | 5/1979 | Rubens et al. | 330/284 |
| 4,334,195 | 6/1982 | Luce | 327/308 |
| 4,496,860 | * 1/1985 | Tokumo | 327/308 |
| 5,745,634 | 4/1998 | Garrett et al. | 385/140 |
| 5,872,475 | * 2/1999 | Otaka | 327/308 |
| 6,073,002 | * 6/2000 | Peterson | 455/326 |
| 6,175,276 | * 1/2001 | Lorenz | 330/260 |

* cited by examiner

Primary Examiner—Toan Tran
Assistant Examiner—Cassandra Cox
(74) Attorney, Agent, or Firm—Michael C. Soldner

(57) ABSTRACT

A dual FET differential voltage controlled attenuator includes a first voltage controlled FET transistor (M1), corresponding to a first control voltage terminal, and a second voltage controlled FET transistor (M2), corresponding to a second control voltage terminal. The first voltage controlled FET transistor attenuates a voltage at an attenuator output by regulating current through a first resistor (R2) connected between an attenuator output and a voltage supply node (Vcc), and the second voltage controlled FET transistor attenuates the voltage at the attenuator output by regulating current through a second resistor (R3) connected between the attenuator output and the voltage supply node. The first and second voltage controlled FET transistors attenuate the voltage at the attenuator output by generating differential currents in the first and second resistors, the differential currents giving a linear transfer function from an attenuator input to the attenuator output of the dual FET differential voltage controlled attenuator.

20 Claims, 3 Drawing Sheets

DUAL FET DIFFERENTIAL VOLTAGE CONTROLLED ATTENUATOR

BACKGROUND OF THE INVENTION

1. Field of the Invention

The present invention relates generally to a dual FET differential voltage controlled attenuator, and more particularly to a dual FET differential voltage controlled attenuator having an improved linear attenuation characteristic over a control voltage range.

2. Description of the Background Art

A signal attenuator is a device that, as the name implies, reduces the magnitude and therefore the electrical energy of an incoming waveform signal. The removed electrical energy is dissipated as heat.

Attenuation is commonly used in electrical circuits. For example, signal attenuators are commonly used in audio circuits, radio frequency (RF) circuits, automatic gain control (AGC) circuits, etc. Generally, a waveform signal is initially amplified to a desired maximum level and then attenuated at points where a lower energy level is desired. Attenuation is generally preferred because during amplification of a signal, any noise on the signal is also amplified. It may therefore be desired to amplify a signal only once, and perform any subsequent actions on the amplified signal.

In the prior art, voltage controlled FETs have been commonly used in attenuators in order to attenuate an input signal. The prior art has applied voltage controlled FETs in a variety of ways, as shown in U.S. Pat. No. 5,745,634 to Garrett et al., U.S. Pat. No. 4,334,195 to Luce, U.S. Pat. No. 4,155,047 to Rubens et al., and U.S. Pat. No. 3,581,222 to Dunwoodie.

However, a common drawback of prior art attenuators is distortion. This distortion may be defined as unwanted changes to a waveform amplitude, especially localized changes, phase shifts, changes in waveform shape, etc. In addition, the prior art attenuators suffer from distortion that varies over a range of control voltage used to set the attenuation level. As a result, the input waveform is changed by the attenuator in undesirable and unpredictable ways.

What is needed, therefore, is an improved attenuator that provides a very linear attenuation over an available control voltage range.

BRIEF DESCRIPTION OF THE DRAWINGS

The features of the present invention which are believed to be novel are set forth with particularity in the appended claims. The invention, together with further objects and advantages thereof, may best be understood by making reference to the following description, taken in conjunction with the accompanying drawings, in the several figures of which like reference numerals identify like elements, and wherein:

DETAILED DESCRIPTION OF THE PREFERRED EMBODIMENT

The distortion problem of the prior art is addressed by the dual FET differential voltage controlled attenuator of the present invention. The dual FET differential voltage controlled attenuator enjoys reduced distortion across the attenuation range by employing a differential dual FET approach. This provides a very linear attenuation characteristic and a substantially constant IIP3 across the control voltage range. The IIP3 is the input intercept point, a point where a theoretical third order distortion component meets the first order component. A high IIP3 value is desirable, indicating that the attenuator can handle more input RF power without causing distortion, hence a high dynamic attenuation range.

Figure 1:
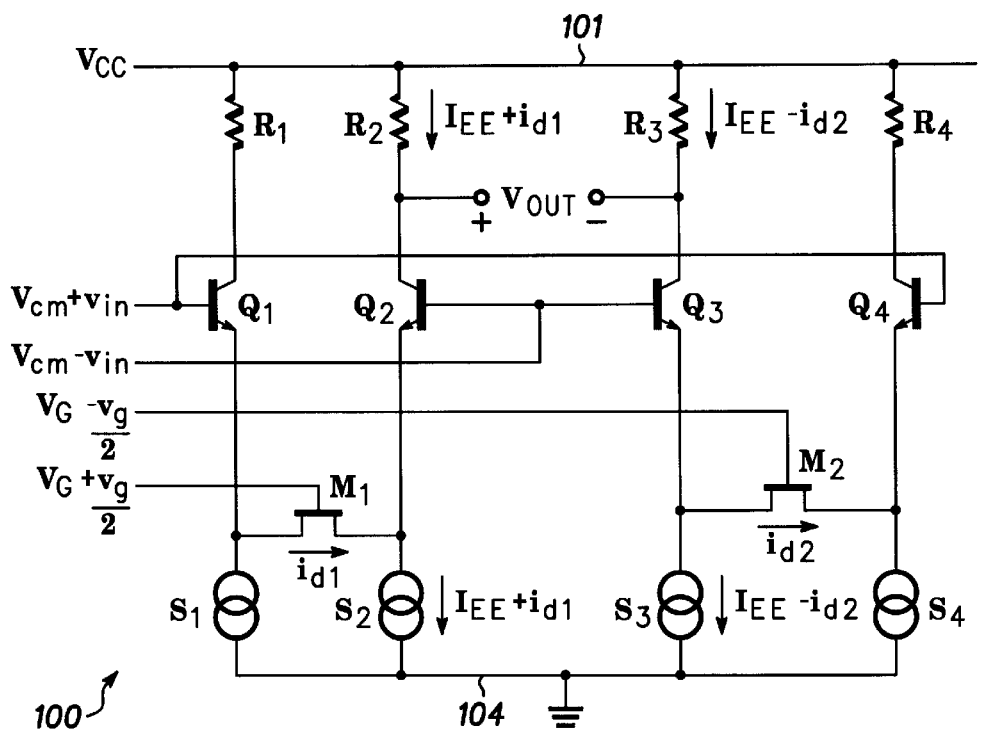
FIG. 1 shows a voltage controlled attenuator of the present invention.

FIG. 1 shows a voltage controlled attenuator 100 according to a preferred embodiment of the present invention. The voltage controlled FET attenuator includes resistors $R_1$–$R_4$, bipolar transistors $Q_1$–$Q_4$, voltage controlled FET transistors $M_1$ and $M_2$, and current sources $S_1$–$S_4$.

The transistors $Q_1$–$Q_4$ are bipolar junction transistors (BJTs). The voltage controlled resistors $M_1$ and $M_2$ are preferably field effect transistors (FETs). Any suitable type of FET may be used, such as a JFET, a MOSFET, etc. The two FETs $M_1$ and $M_2$ are biased in the triode region using a common mode signal $V_G$.

One end of each of the resistors $R_1$–$R_4$ is connected to a DC supply voltage $V_{cc}$ (voltage supply bus 101). The other ends of the resistors $R_1$–$R_4$ are connected to corresponding collector terminals of transistors $Q_1$–$Q_4$. The emitter terminals of transistors $Q_1$–$Q_4$ are connected to corresponding current sources $S_1$–$S_4$. The current sources $S_1$–$S_4$ are further connected to a ground bus 104. Voltage controlled FET transistor $M_1$ is connected across the emitter terminals of transistors $Q_1$ and $Q_2$, while voltage controlled FET transistor $M_2$ is connected across the emitter terminals of transistors $Q_3$ and $Q_4$.

The base terminals of transistors $Q_1$ and $Q_4$ comprise a positive RF input terminal $V_{CM}+V_{in}$, where the input signal is composed of the input signal $V_{in}$ plus the common mode voltage $V_{CM}$. The base terminals of transistors $Q_2$ and $Q_3$ comprise a negative RF input terminal $V_{CM}-V_{in}$. The transistors $Q_1$–$Q_4$ are biased in class A mode when $V_{CM}$ is applied.

Two attenuator control voltage inputs are connected to the gate terminals of the two voltage controlled FET transistors $M_1$ and $M_2$. As for the signal inputs, the control voltage inputs are formed of a common mode voltage $V_G$ and a differential control signal $v_g$. Therefore, the voltage at the positive control voltage terminal is $V_G+v_g$ while the voltage at the negative control voltage terminal is $V_G-v_g$.

The attenuator output is the voltage signal available at the collector terminals of transistors $Q_2$ and $Q_3$.

In operation, the input voltages $V_{CM}+V_{in}$ and $V_{CM}-V_{in}$ are applied to the positive and negative input terminals. The voltage controlled FET transistor $M_1$ attenuates the voltage output at $+V_{out}$ by acting as a variable resistor and regulating a shunt current $i_{d1}$. As a result, the current going through resistor $R_2$ may be increased by adding an additional current component $i_{d1}$ to the current $I_{EE}$ flowing through resistor $R_2$. This can increase the voltage $+V_{out}$ across resistor $R_2$, where $$+V_{out}=V_{cc}-I_2R_2=V_{cc}-R_2(I_{EE}+i_{d1}).$$

Likewise, the input voltages $+V_{in}$ and $-V_{in}$ applied to the positive and negative input terminals cause transistors $Q_3$ and $Q_4$ to turn on. The voltage controlled FET transistor $M_2$ also contributes to the attenuation at the output terminal $-V_{out}$ by regulating a shunt current $i_{d2}$. As a result, the current going through resistor $R_3$ may be decreased by subtracting an additional current component $i_{d2}$ from the current $I_{EE}$ flowing through resistor $R_3$. This can decrease the voltage $-V_{out}$ across resistor $R_3$, where $$-V_{out}=V_{cc}-I_{EE}R_3=V_{cc}-R_3(I_{EE}-i_{d2})$$

The differential control voltages $V_G+v_g/2$ and $V_G-v_g/2$ therefore control the two currents id1 and $i_{d2}$ and add to and subtract from the currents $I_{EE}$ flowing through transistors $Q_2$ and $Q_3$. The drain currents $i_{d1}$ and $i_{d2}$ are out of phase and combine differentially at the load, resulting in the cancellation of the higher order terms and yielding a constant IIP3 across the attenuation range. The result is that the two voltage controlled FET transistors $M_1$ and $M_2$ control the amplitude of the differential output waveform seen at the output $V_{out}=(+V_{out})-(-V_{out})$. Attenuation is thereby achieved.

The use of a pair of voltage controlled FET transistors as described above may be confirmed through examination of applicable equations. A FET operated in a triode region is given as:

$$I_D = \frac{\mu C_{ox}}{2} \frac{W}{L}\left((V_{GS} - V_t)V_{DS} - \frac{1}{2} V_{DS}^2\right) \quad (1)$$

Applying equation 1 to the FETs yields:

$$i_{d1} = \frac{\mu C_{ox}}{2} \frac{W}{L}\left[\left(V_G + \frac{V_g}{2} - V_{ic} + \frac{v_i}{2} - V_t\right)v_i - \frac{1}{2}v_i^2\right] \quad (2)$$

$$i_{d2} = \frac{\mu C_{ox}}{2} \frac{W}{L}\left[\left(V_G - \frac{v_g}{2} - V_{ic} - \frac{v_i}{2} - V_t\right)(-v_i) - \frac{1}{2}v_i^2\right] \quad (3)$$

where $V_G$ is a DC bias voltage and $v_g$ is an input waveform (instantaneous) voltage. At the output:

$$i_{d1} + i_{d2} = I_{EE} + i_{d1} - (I_{EE} - i_{d2}) \quad (4)$$

$$i_{out} = i_{d1} + i_{d2} \quad (5)$$

$$= \mu C_{ox} \frac{W}{L}[v_g v_i + (V_G v_i - V_G v_i) + (V_{ic}v_i - V_{ic}v_i) +$$

$$(V_t v_i - V_t v_i) + (v_i^2 - v_i^2)]$$

simplifies as $$i_{out}=\mu C_{ox}(W/L)(v_g v_i) \quad (6)$$

This yields a very linear equation, with attenuation being varied by varying $v_g$. The attenuation range can be accurately controlled by $v_g$ and the circuit provides a constant IIP3 versus attenuation range.

From the equations it can be seen that the circuit may be used as a baseband modulator or analog multiplier, for example.

One very important feature of this circuit is the ability to control and determine IIP3 through choice of the (W/L) ratio corresponding to the physical size of a channel region of a FET.

On expanding equation (6) as a power series it can be seen that:

$$IM_3 (W/L)^2 \quad (7)$$

Therefore, the dual FET differential voltage controlled attenuator has the ability to increase IIP3 by decreasing the (W/L) FET characteristic. This tradeoff of attenuation control range versus IIP3 has been verified through simulation. An additional feature of the present invention is that the IIP3 of the dual FET differential voltage controlled attenuator is independent of the current $I_{EE}$, with the current $I_{EE}$ being adjusted to keep the BJTs at the appropriate bias point.

Note that if the voltage controlled FET transistors $M_1$ and $M_2$ were replaced with ideal resistors, the output would not be differential. The differential combination of phase inversion that occurs in the drain currents is unique to the dual FET differential voltage controlled attenuator of the present invention. A possible limitation may occur due to mismatch in the FET devices.

Figure 2:
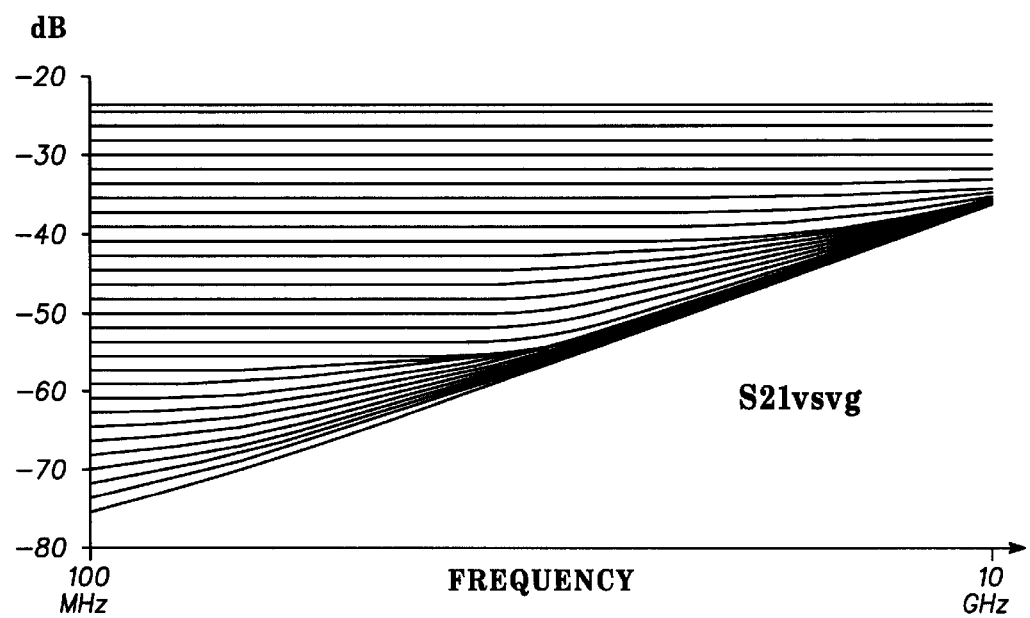
FIG. 2 shows a graph of input-to-output attenuation levels versus frequency response for a variety of levels of control voltages.
Figure 3:
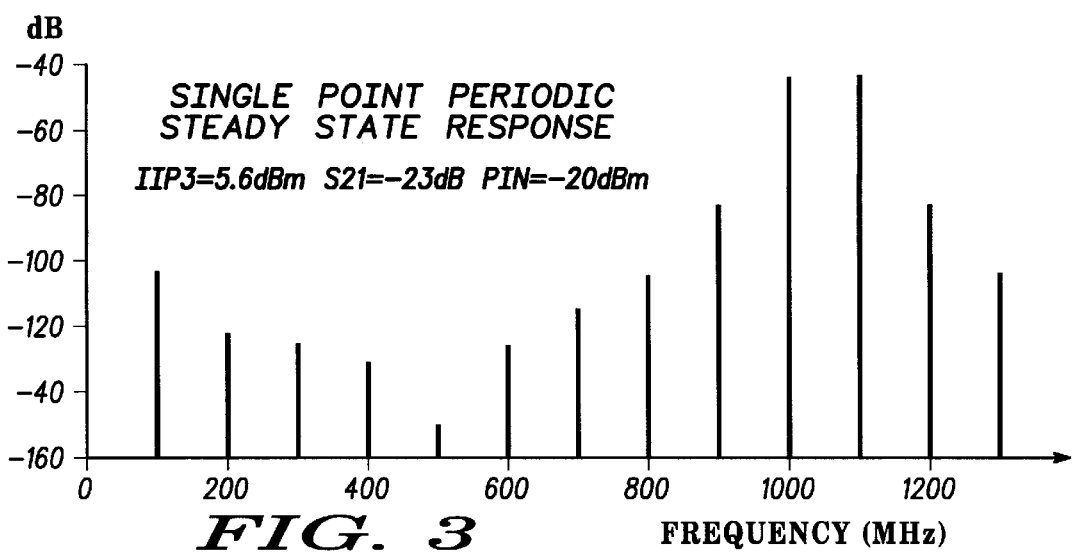
FIGS. 3–8 show graphs of periodic steady state test results for IIP3 at three different power levels.
Figure 4:
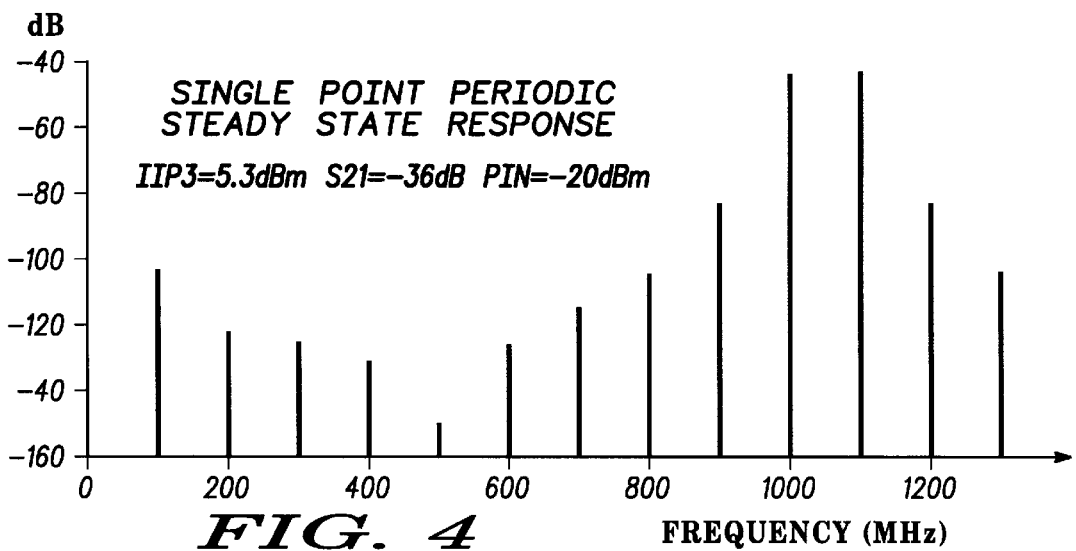
Figure 5:
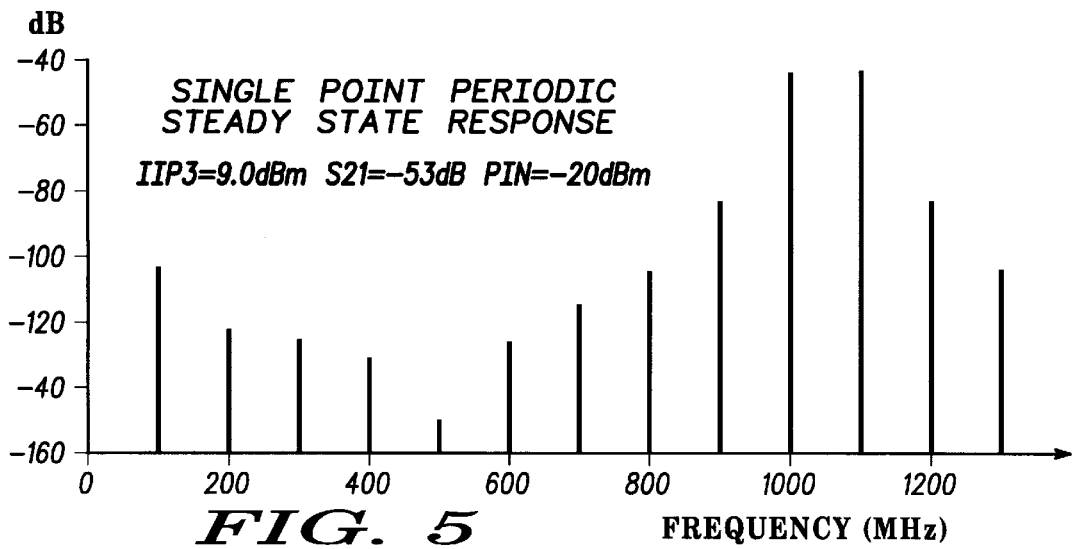
Figure 6:
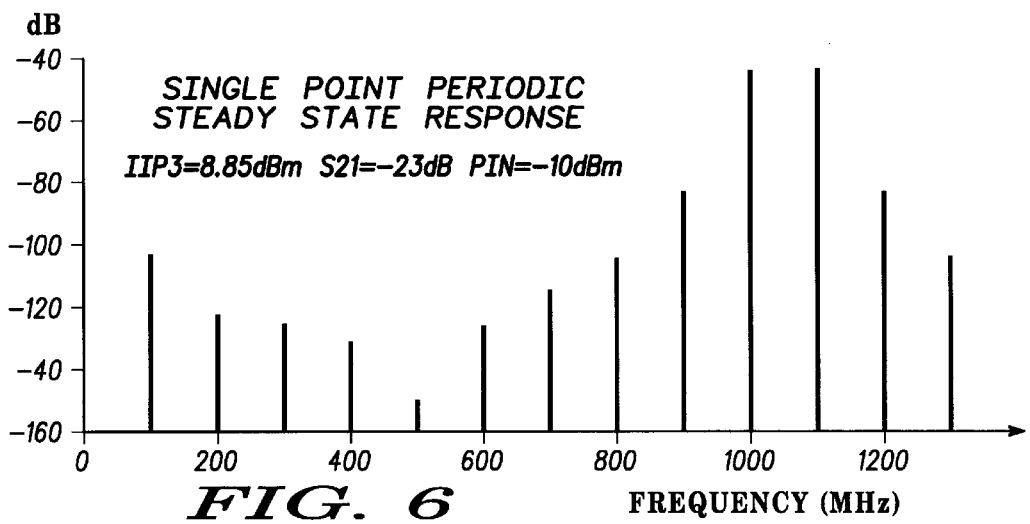
Figure 7:
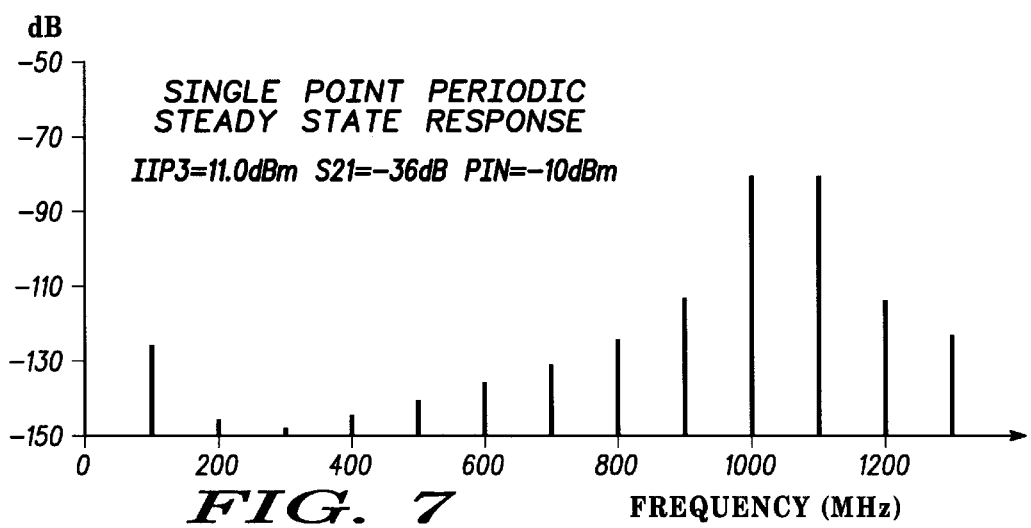
Figure 8:
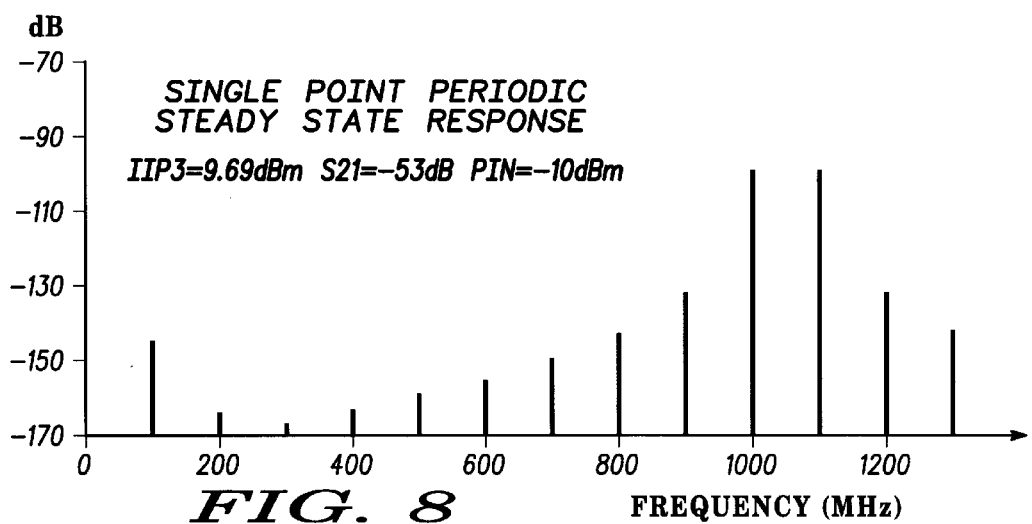

FIG. 2 shows a graph of input-to-output (S21) attenuation levels versus frequency response for a variety of levels of control voltages $v_g$. This graph illustrates a wide bandwidth from about 100 megahertz (MHz) to about 2 gigahertz (GHz), and a wide range of control voltages $v_g$, producing an attenuation range of about 50 dB at 100 MHz. As can be seen from the figure, the attenuation range is somewhat decreased at higher frequencies, having an attenuation range of about 40 dB at an operating frequency of 1 GHz, and an attenuation range of about 35 dB at an operating frequency of 2 GHz.

It should be noted that the attenuation range may be increased by decreasing FET device sizes, thereby reducing parasitic capacitances. In addition, the attenuation range may be increased by increasing the (W/L) characteristic through the choice of FETs (see equation (6)).

FIGS. 3–8 show graphs of periodic steady state test results for IIP3 at three different power levels. An average IIP3 value greater than 5 dBm is obtained across the attenuation range for a current drain of less than 5 mA. Previous designs, using FETs as variable resistors, had significant degradation of IIP3 values as the FET devices approached their cutoff region. The dual FET differential voltage controlled attenuator of the present invention and the differential cancellation technique employed herein circumvents the problem and yields a constant IIP3 across the attenuation range.

The IIP3 results shown in FIGS. 3–8 are summarized below in Table 1.

TABLE 1

| ATTEN-UATION | Pinput = −20 dBm | Pinput = −10 dBm | Pinput = 0 dBm |
|---|---|---|---|
| Low | 5.6 dBm | 8.85 dBm | 5.345 dBm |
| Medium | 5.33 dBm | 11.0 dBm | 11.08 dBm |
| High | 9 dBm | 9.695 dBm | 10.64 dBm |

In summary, the invented circuit provides an attenuation range greater than or equal to about 40 dB at 1 GHz, a wide bandwidth of about 100 MHz to about 2 GHz, and a consistent IIP3 greater than or equal to about 5 dBm across the attenuation range. This is achieved with a current drain of less than about 5 milliamps.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A dual FET differential voltage controlled attenuator having an attenuator input and an attenuator output, comprising:

a first resistor and a second resistor connected between the attenuator output and a voltage supply node;

a first voltage controlled FET transistor, corresponding to a first control voltage terminal, attenuating a voltage at the attenuator output by regulating current through the first resistor; and a second voltage controlled FET transistor, corresponding to a second control voltage terminal, attenuating the voltage at the attenuator output by regulating current through the second resistor, wherein the first and second voltage controlled FET transistors attenuate the voltage at the attenuator output by generating differential currents in the first and second resistors, the differential currents giving a linear transfer function from the attenuator input to the attenuator output.

2. The dual FET differential voltage controlled attenuator of claim 1, further comprising:

a third resistor and a fourth resistor connected to the voltage supply node;

a first transistor and a second transistor having respective first and second collector terminals, first and second base terminals, and first and second emitter terminals, the first collector terminal connected to the third resistor and the second collector terminal connected to the first resistor, the first and the second base terminals connected to a differential input waveform, and the first and second emitter terminals connected to the first voltage controlled FET transistor;

a third transistor and a fourth transistor having respective third and fourth collector terminals, third and fourth base terminals, and third and fourth emitter terminals, the third collector terminal connected to the second resistor and the fourth collector terminal connected to the fourth resistor, the third and fourth base terminals connected to the differential input waveform, and the third and fourth emitter terminals connected to the second voltage controlled FET transistor, wherein a resistance characteristic of the first voltage controlled FET transistor is varied by voltage applied by the first control voltage terminal, and a resistance characteristic of the second voltage controlled FET transistor is varied by voltage applied by the second control voltage terminal.

3. The dual FET differential voltage controlled attenuator of claim 2, wherein the attenuator output includes a first output terminal and a second output terminal outputting an attenuated differential input waveform, the first output terminal positioned between the first resistor and the second collector terminal, and the second output terminal positioned between the second resistor and the third collector terminal, and wherein attenuation of the differential input waveform is controlled by a differential control voltage applied by the first and the second control voltage terminals.

4. The dual FET differential voltage controlled attenuator of claim 3, further comprising a first, a second, a third, and a fourth current source connected to ground and being further connected, respectively, between the first, second, third and fourth emitter of the corresponding first, second, third and fourth transistors.

5. The dual FET differential voltage controlled attenuator of claim 4, wherein the first voltage controlled FET transistor controls a size of a first cross current flowing from the first emitter terminal to the second emitter terminal and wherein the second voltage controlled FET transistor controls a size of a second cross current flowing from the third emitter terminal to the fourth emitter terminal.

6. The dual FET differential voltage controlled attenuator of claim 5, wherein the first voltage controlled FET transistor adds to current flowing through the first resistor and the second voltage controlled FET transistor subtracts from current flowing through the second resistor.

7. The dual FET differential voltage controlled attenuator of claim 6, wherein the first output terminal is a positive differential output terminal and the second output terminal is a negative differential output terminal.

8. The dual FET differential voltage controlled attenuator of claim 7, wherein the resistance characteristics of the first and second voltage controlled FET transistors are partially controlled by a physical size of a channel region.

9. The dual FET differential voltage controlled attenuator of claim 8, wherein the resistance characteristics of the first and second voltage controlled FET transistors are partially controlled by an oxide layer capacitance characteristic.

10. The dual FET differential voltage controlled attenuator of claim 9, wherein the resistance characteristics of the first and second voltage controlled FET transistors are partially controlled by a mobility factor characteristic.

11. The dual FET differential voltage controlled attenuator of claim 10, wherein the first and second voltage controlled FET transistors are JFETs.

12. The dual FET differential voltage controlled attenuator of claim 10, wherein the first and second voltage controlled FET transistors are MOSFETs.

13. The dual FET differential voltage controlled attenuator of claim 10, wherein the first, second, third, and fourth transistors are BJTs.

14. A dual FET differential voltage controlled attenuator having an attenuator input and an attenuator output, comprising:

a first resistor and a second resistor connected between the attenuator output and a voltage supply node;

a first control voltage terminal and a second control voltage terminal, the first and second control voltage terminals including a common mode voltage and a differential control signal;

a first transistor and a second transistor, the first transistor having a first emitter terminal, a first collector terminal connected to the voltage supply node through a third resistor, and a first base terminal connected to a first input terminal of the attenuator input, and the second transistor having a second emitter terminal, a second collector terminal connected to the first resistor, and a second base terminal connected to a second input terminal of the attenuator input, the first and second input terminals generating a differential input waveform;

a third transistor and a fourth transistor, the third transistor having a third emitter terminal, a third collector terminal connected to the second resistor, and a third base terminal connected to the second input terminal of the attenuator input, and the fourth transistor having a fourth emitter terminal, a fourth collector terminal connected to the voltage supply node through a fourth resistor, and a fourth base terminal connected to the first terminal of the attenuator input;

a first voltage controlled FET transistor, connected across the first and second emitter terminals, having a first gate terminal connected to the first control voltage terminal; and a second voltage controlled FET transistor, connected across the third and fourth emitter terminals, having a second gate terminal connected to the second control voltage terminal, wherein a first shunt current and a second shunt current corresponding to the first and second voltage controlled FET transistors, respectively, flows through the first and second resistors, respectively, and the differential control signal of the first and second control voltages is varied to control the first and second shunt currents to add to and subtract from current flowing through the second and third resistors corresponding to the second and third transistors to attenuate the differential input waveform.

15. The voltage controlled attenuator of claim 14, wherein a resistance characteristic of the first and second voltage controlled FET transistors is controlled by a physical size of a channel region of the first and second voltage controlled FET transistors.

16. The voltage controlled attenuator of claim 14, wherein a resistance characteristic of the first and second voltage controlled FET transistors is partially controlled by a mobility factor characteristic.

17. The voltage controlled attenuator of claim 14, wherein the first and second voltage controlled FET transistors are JFETs.

18. The voltage controlled attenuator of claim 14, wherein the first and second voltage controlled FET transistors are MOSFETs.

19. The voltage controlled attenuator of claim 14, wherein the first, second, third and fourth transistors are BJTs.

20. A voltage controlled attenuator, comprising:

transistor means for receiving at input terminals thereof a differential input waveform, and outputting at output terminals thereof a differential output waveform which is an attenuated version of the differential input waveform; and current varying means coupled to the transistor means for varying a magnitude of shunt currents flowing through the transistor means in accordance with a differential control voltage applied to input terminals of the current varying means, to thereby vary in a substantially linear manner an attenuation of the differential input waveform to produce the differential output waveform.

* * * * *